United States Patent
Takemoto et al.

(10) Patent No.: US 10,361,110 B2
(45) Date of Patent: Jul. 23, 2019

(54) SUBSTRATE HOLDING APPARATUS

(71) Applicant: SHINKO ELECTRIC INDUSTRIES CO., LTD., Nagano (JP)

(72) Inventors: Keiichi Takemoto, Nagano (JP); Yoichi Harayama, Nagano (JP); Yoji Asahi, Nagano (JP); Shuzo Aoki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 215 days.

(21) Appl. No.: 15/662,480

(22) Filed: Jul. 28, 2017

(65) Prior Publication Data

US 2018/0047604 A1 Feb. 15, 2018

(30) Foreign Application Priority Data

Aug. 9, 2016 (JP) .................................. 2016-156470

(51) Int. Cl.
| | | |
|---|---|---|
| *B23Q 3/00* | (2006.01) | |
| *H01L 21/683* | (2006.01) | |
| *H01L 21/67* | (2006.01) | |

(52) U.S. Cl.
CPC .... *H01L 21/6831* (2013.01); *H01L 21/67103* (2013.01)

(58) Field of Classification Search
CPC ..... B25B 11/00; B25B 11/02; H01L 21/6831; H01L 21/6833; H01L 21/00
See application file for complete search history.

(56) References Cited

U.S. PATENT DOCUMENTS

| 9,343,346 | B2 | 5/2016 | Kosakai et al. | |
|---|---|---|---|---|
| 2006/0209490 | A1* | 9/2006 | Nakamura | H01L 21/67288 361/234 |
| 2010/0244350 | A1* | 9/2010 | Fujisato | C23C 14/50 269/289 R |
| 2013/0127124 | A1* | 5/2013 | Nam | H01J 37/32577 279/128 |
| 2014/0063681 | A1* | 3/2014 | Anada | H01L 21/68757 361/234 |
| 2014/0103612 | A1* | 4/2014 | Tsutsumi | C04B 35/117 279/128 |
| 2018/0047604 | A1* | 2/2018 | Takemoto | H01L 21/6831 |

FOREIGN PATENT DOCUMENTS

JP 2014-078731 5/2014

* cited by examiner

*Primary Examiner* — Lee D Wilson
(74) *Attorney, Agent, or Firm* — IPUSA, PLLC

(57) ABSTRACT

A substrate holding apparatus includes a baseplate, a heating unit disposed over the baseplate, and an electrostatic chuck disposed on the heating unit, wherein the heating unit includes a heating element having at least one roughened surface and an insulating layer enclosing the heating element, and the insulating layer and the electrostatic chuck are directly bonded to each other.

5 Claims, 7 Drawing Sheets

SUBSTRATE HOLDING APPARATUS

CROSS-REFERENCE TO RELATED APPLICATIONS

The present application is based upon and claims the benefit of priority from the prior Japanese Patent Application No. 2016-156470 filed on Aug. 9, 2016, with the Japanese Patent Office, the entire contents of which are incorporated herein by reference.

FIELD

The disclosures herein relate to a substrate holding apparatus and a method of producing the same.

BACKGROUND

A film deposition apparatus (e.g., a chemical vapor deposition apparatus, a physical vapor deposition apparatus, or the like) and a plasma etching apparatus are used in the process of manufacturing a semiconductor device such as an IC (integrated circuit) or an LSI (large scale integration). These apparatuses have a stage for holding a wafer in place with high accuracy in a vacuum processing chamber. An example of such a stage is a substrate holding apparatus that clamps a wafer with an electrostatic chuck mounted on a baseplate.

Some substrate holding apparatuses are configured such that a heating element is embedded in the ceramics of an electrostatic chuck for the purpose of adjusting the wafer temperature. In this configuration, the heating element is formed of screen printed paste (e.g., tungsten paste). Poor precision in screen printing, however, is likely to result in variation in the thickness of printed material. Variation in the thickness of a heating element results in variation in generated heat, thereby giving rise to a problem in that thermal uniformity is undermined.

In consideration of this, studies have been underway to develop the structure in which a metal member formed as a heating element is bonded through an adhesive to the surface of an electrostatic chuck.

The above-noted structure has the problem that the adhesive agent dissolves and disengages above a certain temperature (e.g., 150 degrees Celsius) due to the limited heat tolerance of adhesive agent. There is a demand for improvement in the heat tolerance of a substrate holding apparatus.

RELATED-ART DOCUMENTS

Patent Document

[Patent Document 1] Japanese Patent Application Publication No. 2014-78731

SUMMARY

According to an aspect of the embodiment, a substrate holding apparatus includes a baseplate, a heating unit disposed over the baseplate, and an electrostatic chuck disposed on the heating unit, wherein the heating unit includes a heating element having at least one roughened surface and an insulating layer enclosing the heating element, and the insulating layer and the electrostatic chuck are directly bonded to each other.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
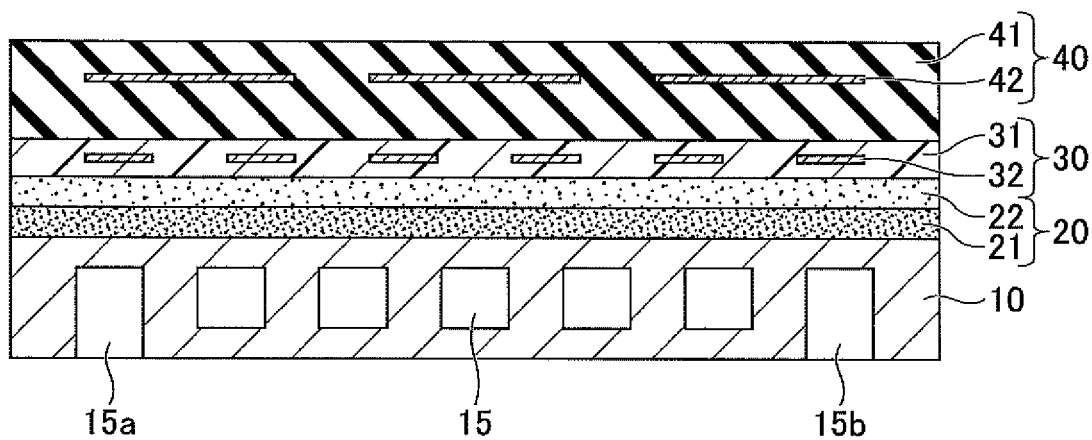
FIG. 1 is a cross-sectional view providing a schematic illustration of a substrate holding apparatus according to a first embodiment.

In the following, embodiments will be described by referring to the accompanying drawings. In the drawings, the same elements are referred to by the same references, and duplicate description thereof may be omitted.

First Embodiment

[Structure of Substrate Holding Apparatus]

FIG. 1 is a cross-sectional view providing a schematic illustration of a substrate holding apparatus according to a first embodiment. As illustrated in FIG. 1, a substrate holding apparatus 1 includes a baseplate 10, an adhesive layer 20, a heating unit 30, and an electrostatic chuck 40 as main components.

The baseplate 10 is a member for supporting the heating unit 30 and the electrostatic chuck 40. The thickness of the baseplate 10 may approximately be 20 to 50 mm, for example. The baseplate 10 may be made of aluminum, for example, which may also serve as an electrode or the like for controlling plasma. Supplying a predetermined amount of high-frequency electric power to the baseplate 10 enables the control of energy with which generated plasma ions impact a wafer held on the electrostatic chuck 40, thereby achieving an efficient etching process.

The baseplate 10 has a coolant pathway 15 disposed therein. The coolant pathway 15 has a coolant inlet 15a at one end and a coolant outlet 15b at the other end. The coolant pathway 15 is connected to a coolant control apparatus (not shown) provided separately from the substrate holding apparatus 1. The coolant control apparatus (not shown) feeds coolant into the coolant pathway 15 at the coolant inlet 15a, and receives coolant discharged from the coolant outlet 15b. Circulating coolant through the coolant pathway 15 to cool the baseplate 10 causes a wafer held on the electrostatic chuck 40 to be cooled. The baseplate 10 may have a gas pathway or the like for conducting inert gas that cools a wafer held on the electrostatic chuck 40, in addition to or in place of the coolant pathway 15.

The heating unit 30 is fixedly attached to the baseplate 10 through the adhesive layer 20. The adhesive layer 20 may have a two-layer structure including a first layer 21 and a second layer 22, for example. Silicone adhesive agent may be used as the first layer 21 and the second layer 22. The thickness of each of the first layer 21 and the second layer 22 may approximately be 1 mm, for example. The thermal conductivity of the first layer 21 and the second layer 22 may preferably be 2 W/mK or higher. The adhesive layer 20 may alternatively be formed as a single layer. A two-layer structure combining an adhesive agent having high thermal conductivity and an adhesive agent having a low coefficient of elasticity, however, provides an advantage in reducing the stress caused by a difference in thermal expansion between the support base and the aluminum baseplate.

The heating unit 30 includes an insulating layer 31 and a heating element 32 embedded in the insulating layer 31. The heating element 32 may be a single winding conductive track extending in a horizontal plane to cover substantially the entire horizontal expanse of the heating unit 30. Electric power may be applied to the two ends of the conductive track to generate heat. The heating element 32 may alternatively be two or more winding conductive tracks to which electric power is applied separately. The heating element 32 is covered with and enclosed (or encapsulated) in the insulating layer 31 to be protected from external hazards. The heating element 32 may preferably be formed of rolled alloy. The use of rolled alloy enables the reduction of variation in the thickness of the heating element 32, thereby improving heat distribution. The heating element 32 does not have to be situated at the midpoint in the thickness direction of the insulating layer 31. Depending on the required specification, the heating element 32 may be situated toward the baseplate 10 or toward the electrostatic chuck 40 relative to the midpoint in the thickness direction of the insulating layer 31.

The specific resistance of the heating element 32 is preferably 10 to 70 $\mu\Omega\cdot$cm, and is more preferably 10 to 50 $\mu\Omega\cdot$cm. Conventional substrate holding apparatuses employ heating elements made of NiCr having a specific resistance of approximately 100 $\mu\Omega\cdot$cm. With the placement design to make such heating elements have a resistance of 20 to 50$\Omega$, conductive traces would have to have a width of approximately 1 to 2 mm and a thickness of approximately 50 $\mu$m, which means that it would be difficult to provide a fine heating element pattern. The heating element 32 is made to have a specific resistance of 10 to 70 $\mu\Omega\cdot$cm, which is lower than the specific resistance of NiCr heating elements. The placement design to make such heating element 32 have a resistance of 20 to 50$\Omega$ enables the provision of a heating element pattern that is finer than in the conventional art. It may be noted that a specific resistance lower than 10 $\mu\Omega\cdot$cm is not preferable due to the lowering of heating property.

Examples of rolled alloys suitable for use as the heating element 32 include Constantan CN49 which is an alloy of Cu, Ni, Mn, and Fe, Zeranin (registered trademark) which is an alloy of Cu, Mn, and Sn, and Manganin (registered trademark) which is an alloy of Cu, Mn, and Ni. The specific resistance of Constantan CN49 is approximately 50 $\mu\Omega\cdot$cm. The specific resistance of Zeranin is approximately 29 $\mu\Omega\cdot$cm. The specific resistance of Manganin is approximately 44 $\mu\Omega\cdot$cm. The thickness of the heating element 32 is preferably 60 $\mu$m or less in consideration of the formability of conductive patterns through etching.

The insulating layer 31 may be made of a bismaleimide triazine resin or an epoxy resin having high thermal conductivity and high heat tolerance, for example. The thermal conductivity of the insulating layer 31 is preferably 3 W/mK or higher. Incorporating fillers such as alumina or aluminum nitride into the insulating layer 31 serves to improve the thermal conductivity of the insulating layer 31. The glass transition temperature (Tg) of the insulating layer 31 is preferably 250 degrees Celsius or higher. The thickness of the insulating layer 31 is preferably about 100 to 150 $\mu$m. Variation in the thickness of the insulating layer 31 is $\pm 10\%$ or smaller.

In order to improve adhesion between the heating element 32 and the insulating layer 31 under high temperature, at least one of the surfaces (i.e., one or both of the upper and lower surfaces) of the heating element 32 is preferably a roughened surface. Both of the upper and lower surfaces may properly be roughened surfaces. In this case, the upper surface and the lower surface of the heating element 32 may be subjected to respective, different roughening processes. The roughening process is not limited to a particular process, and may be an etching-based process, a process utilizing a coupling-agent-based surface modification technology, a process of forming dots by use of UV-YAG laser having a wavelength of 355 nm or shorter, or the like.

The electrostatic chuck 40 serves to attract and hold a wafer that is an object to be held. The diameter of the wafer that is an object to be held by the electrostatic chuck 40 may approximately be 8, 12, or, 18 inches, for example.

The electrostatic chuck 40 is disposed on the heating unit 30. The electrostatic chuck 40 includes a support base 41 and an electrostatic electrode 42. The electrostatic chuck 40 may be a Johnsen-Rahbeck electrostatic chuck. The electrostatic chuck 40 may alternatively be a Coulomb-type electrostatic chuck.

The support base 41 may be made of dielectric material such as ceramics of aluminum oxide ($Al_2O_3$), aluminum nitride (AlN), or the like. The thickness of the support base 41 may be in a range of approximately 1 to 10 mm. The relative permittivity of the support base 41 at 1 KHz may be in a range of approximately 9 to 10. The electrostatic chuck 40 and the insulating layer 31 of the heating unit 30 are directly bonded to each other. Direct bonding of the heating unit 30 to the electrostatic chuck 40 without an intervening adhesive serves to improve the upper temperature limit of the substrate holding apparatus 1. The upper temperature limit of a conventional substrate holding apparatus having a heating unit and an electrostatic chuck bonded to each other with an adhesive is approximately 150 degrees Celsius. In contrast, the upper temperature limit of the substrate holding apparatus 1 is approximately 200 degrees Celsius.

The electrostatic electrode 42 is a thin-film electrode that is embedded in the support base 41. The electrostatic electrode 42 is coupled to a power supply (not shown) provided separately from the substrate holding apparatus 1. Upon receiving a predetermined voltage, the electrostatic electrode generates an electrostatic-based clamping force with respect to a wafer, thereby causing the wafer to be held down on the electrostatic chuck 40. The clamping force increases as the voltage applied to the electrostatic electrode 42 increases. The electrostatic electrode 42 may have either a monopole structure or a dipole structure. Tungsten, molybdenum, or the like may be used as the material of the electrostatic electrode 42.

[Method of Making Substrate Holding Apparatus]

FIGS. 2A through 2D and FIGS. 3A through 3C are drawings illustrating examples of the process steps of making the substrate holding apparatus according to the first embodiment. A description will be given of the process steps of making the substrate holding apparatus 1 by referring to FIGS. 2A through 2D and FIGS. 3A through 3C, with the focus on the steps of forming the heating unit 30. It may be noted that what is illustrated in FIGS. 2A through 2D and FIGS. 3A and 3B is placed upside down relative to FIG. 1.

Figure 2A:
FIGS. 2A through 2D are drawings illustrating examples of process steps for making the substrate holding apparatus according to the first embodiment.

In the process step illustrated in FIG. 2A, the electrostatic chuck 40 having the electrostatic electrode 42 embedded in the support base 41 is produced by a known manufacturing procedure including a step of forming vias through a green sheet, a step of filling the vias with conductive paste, a step of forming a pattern to become an electrostatic electrode, a step of laminating another green sheet over the noted green sheet for calcination, and a step of planarizing the surfaces. In order to improve adhesiveness with respect to an insulating resin film 311, the surface of the electrostatic chuck 40 on which the insulating resin film 311 is to be laminated may be subjected to a blast process for roughening.

Figure 2B:
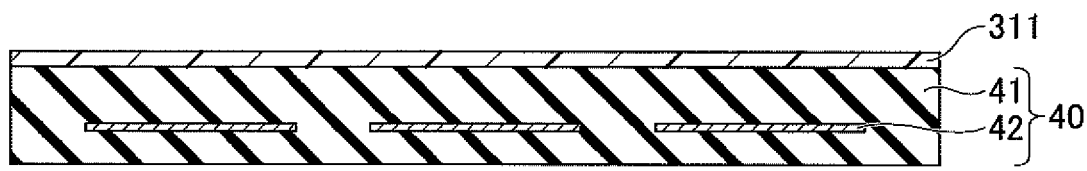

In the process step illustrated in FIG. 2B, the insulating resin film 311 is directly laminated onto the electrostatic chuck 40. The insulating resin film 311 is preferably laminated in a vacuum from the viewpoint of reducing the likelihood of inclusion of voids. The insulating resin film 311 is not cured, and is left in a semi-cured state (i.e., B stage). The adhesive strength of the semi-cured insulating resin film 311 allows the insulating resin film 311 to be tentatively secured on the electrostatic chuck 40.

The insulating resin film 311 may be made of a bismaleimide triazine resin or an epoxy resin having high thermal conductivity and high heat tolerance, for example. The thermal conductivity of the insulating resin film 311 is preferably 3 W/mK or higher. Incorporating fillers such as alumina or aluminum nitride into the insulating resin film 311 serves to improve the thermal conductivity of the insulating resin film 311. The glass transition temperature (Tg) of the insulating resin film 311 is preferably 250 degrees Celsius or higher. From the viewpoint of increasing thermal conductivity (i.e., increasing the speed of thermal conduction), the thickness of the insulating resin film 311 is preferably 60 μm or thinner, and variation in the thickness of the insulating resin film 311 is preferably ±10% or smaller.

Figure 2C:
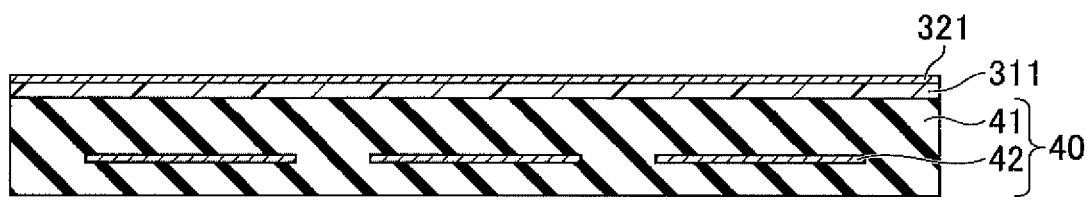

In the process step illustrated in FIG. 2C, a metal foil 321 is disposed on the insulating resin film 311. The material of the metal foil 321 may be a rolled alloy, examples of which are previously listed as examples of the material of the heating element 32. The thickness of the metal foil 321 is preferably 60 μm or less in consideration of the formability of conductive patterns through etching. The adhesive strength of the semi-cured insulating resin film 311 allows the metal foil 321 to be tentatively secured on the insulating resin film 311.

It is preferable to roughen at least one of the surfaces (i.e., one or both of the upper and lower surfaces) of the metal foil 321 before placement on the insulating resin film 311. Both of the upper and lower surfaces of the metal foil 321 may properly be roughened surfaces. In this case, the upper surface and the lower surface of the metal foil 321 may be subjected to respective, different roughening processes. The roughening process is not limited to a particular process, and may be an etching-based process, a process utilizing a coupling-agent-based surface modification technology, a process of forming dots by use of UV-YAG laser having a wavelength of 355 nm or shorter, or the like.

With the use of the process of forming dots, roughening can be performed with respect to the areas of the metal foil 321 that are selected according to need. With the use of the process of forming dots, it is not required to roughen the entire surface of the metal foil 321, but it suffices to roughen only the areas that are to remain as the heating element 32 (i.e., there is no need to roughen the areas that are to be removed by etching).

Figure 2D:
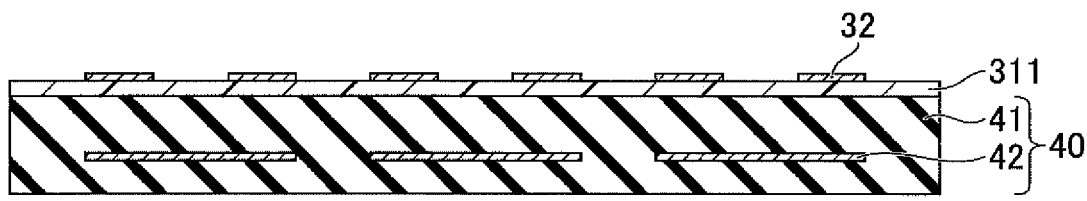

In the process step illustrated in FIG. 2D, the metal foil 321 is patterned to form the heating element 32. Specifically, resist may be formed over the entirety of the metal foil 321, and may then be subjected to exposure and development to form a resist pattern, which covers the metal foil 321 only at the position at which the metal foil 321 is to remain as the heating element 32. Subsequently, the portion of the metal foil 321 that is not covered with the resist pattern is removed by etching. Etching solution for removing the metal foil 321 may be a copper chloride etching solution or a ferric chloride etching solution, for example.

Subsequently, the resist pattern is removed by stripping solution, which leaves the heating element 32 formed at the intended position on the insulating resin film 311. The use of photolithography to form the heating element 32 as described above allows variation in the size of the heating element 32 in the widthwise direction to be reduced, thereby improving heat distribution. The cross-section of the heating element 32 formed by etching may be formed into a substantially trapezoid shape, for example. In such a case, the difference between the width of a conductive trace at the face in contact with the insulating resin film 311 and the width at the opposite face may be set to approximately 10 to 50 μm. Shaping the cross-section of the heating element 32 into a simple substantially trapezoid shape serves to improve heat distribution.

Figure 3A:
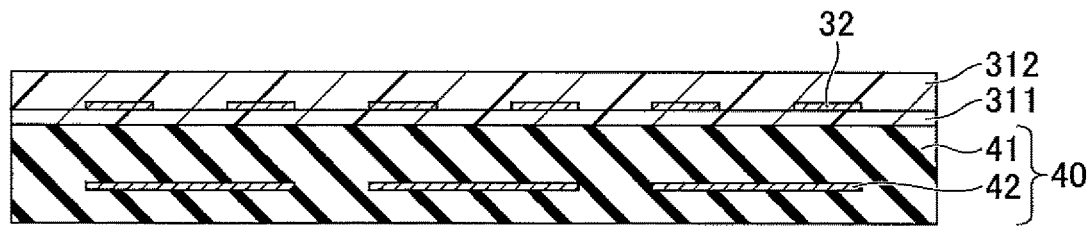
FIGS. 3A through 3C are drawings illustrating examples of process steps for making the substrate holding apparatus according to the first embodiment.

In the process step illustrated in FIG. 3A, an insulating resin film 312 is laminated onto the insulating resin film 311 to cover the heating element 32. The insulating resin film 312 is preferably laminated in a vacuum from the viewpoint of reducing the likelihood of inclusion of voids. The material of the insulating resin film 312 may the same as or similar to that of the insulating resin film 311, for example. The thickness of the insulating resin film 312 may properly be selected within the range that enables the covering of the heating element 32. The same thickness as that of the insulating resin film 311 is not necessarily required.

Figure 3B:
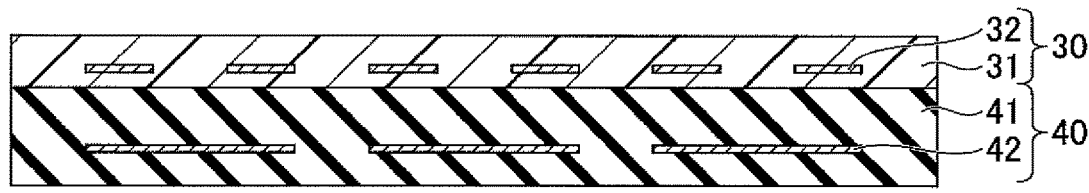

In the process step illustrated in FIG. 3B, the insulating resin films 311 and 312 are heated and cured above the curing temperature while the insulating resin films 311 and 312 are pressed against the electrostatic chuck 40. This results in the insulating resin films 311 and 312 being consolidated into a single insulating layer 31, thereby producing the heating unit 30 that has the heating element 32 covered with and enclosed (or encapsulated) in the insulating layer 31, with the insulating layer 31 of the heating unit 30 being directly bonded to the electrostatic chuck 40. In consideration of the stress caused by a return to normal temperature, the heating temperature of the insulating resin films 311 and 312 is preferably 200 degrees Celsius or lower.

Heating and curing while pressing the insulating resin films 311 and 312 against the electrostatic chuck 40 serve to reduce unevenness in the upper surface (i.e., the surface not in contact with the electrostatic chuck 40) of the insulating layer 31 caused by the presence of the heating element 32, thereby enabling planarization. It is preferable to set the unevenness of the upper surface of the insulating layer 31 to 7 μm or smaller. Setting the unevenness of the upper surface of the insulating layer 31 to 7 μm or smaller serves to prevent air bubbles from becoming trapped between the insulating layer 31 and the adhesive layer 20 (i.e., the second layer 22 to be more specific) at the next process step. Namely, adhesiveness between the insulating layer 31 and the adhesive layer 20 (i.e., the second layer 22) is prevented from being decreased.

Figure 3C:
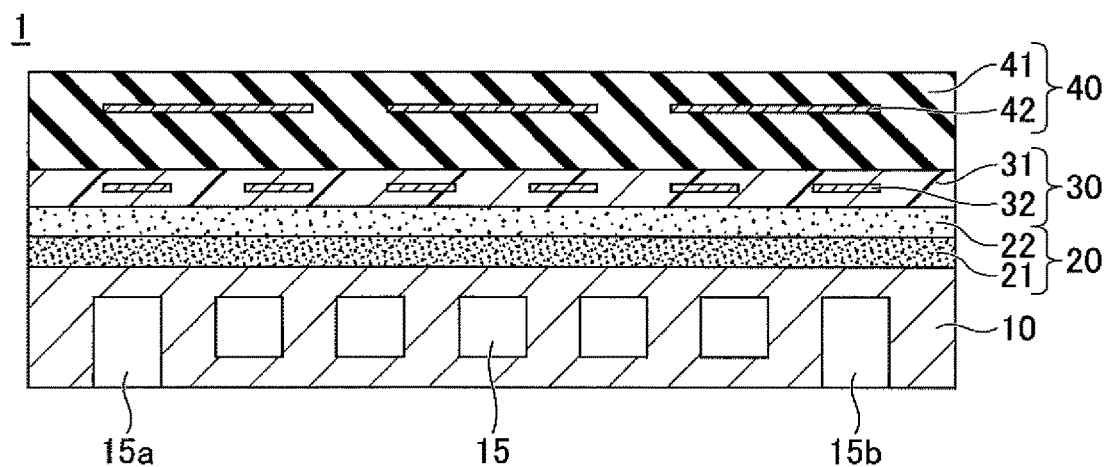

In the process step illustrated in FIG. 3C, the baseplate 10 having the coolant pathway 15 and the like formed therein is prepared, on which the first layer 21 and the second layer 22 are successively laminated to form the adhesive layer 20 (uncured). The structure illustrated in FIG. 3B is then turned upside down and placed on the baseplate with the adhesive layer 20 intervening therebetween, followed by curing the adhesive layer 20. With this, the substrate holding apparatus 1 is completed in which the heating unit 30 and the electrostatic chuck 40 are successively stacked over the baseplate 10 with the adhesive layer 20 intervening therebetween.

As described above, the substrate holding apparatus 1 of the first embodiment has the electrostatic chuck 40 and the insulating layer 31 of the heating unit 30 directly bonded to each other, which is different from the conventional configuration that employs an adhesive having low tolerance to heat. This arrangement thus enables the improvement of the upper temperature limit of the substrate holding apparatus 1. Roughening at least one surface of the heating element 32 serves to improve the adhesiveness between the heating element 32 and the insulating layer 31 at high temperature.

Second Embodiment

The second embodiment is directed to an example in which a heat transfer sheet is embedded in the heating unit. In connection with the second embodiment, a description of the same or similar constituent elements as those of the previously provided descriptions may be omitted as appropriate.

[Structure of Substrate Holding Apparatus]

Figure 4:
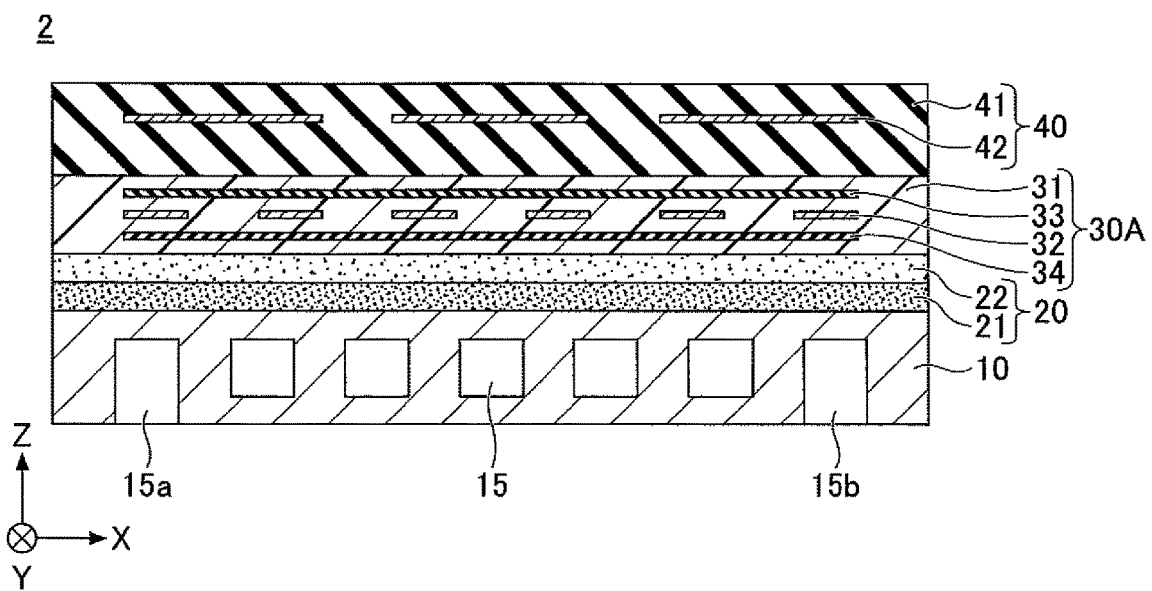
FIG. 4 is a cross-sectional view providing a schematic illustration of a substrate holding apparatus according to a second embodiment.

FIG. 4 is a cross-sectional view providing a schematic illustration of a substrate holding apparatus according to a second embodiment. In FIG. 4, directions perpendicular to each other extending within a plane parallel to the upper face of the baseplate 10 are referred to as an X direction and a Y direction, respectively, and a direction (i.e., the thickness direction of a substrate holding apparatus 2) perpendicular to both the X direction and the Y direction is referred to as a Z direction.

In FIG. 4, a substrate holding apparatus 2 differs from the substrate holding apparatus 1 (see FIG. 1) in that the heating unit 30 is replaced with a heating unit 30A.

In the substrate holding apparatus 2, the insulating layer 31 of the heating unit 30A includes heat transfer sheets 33 and 34 embedded therein in addition to the heating element 32. The heat transfer sheets 33 and 34 are disposed in parallel to the X-Y plane at a spaced vertical interval, and face each other with the heating element 32 placed therebetween. The spaces between the heating element 32 and the heat transfer sheets 33 and 34 are filled with the insulating layer 31. Similarly to the heating element 32, the heat transfer sheets 33 and are covered with and enclosed in the insulating layer 31.

The heat transfer sheets 33 and 34 are not limited to a particular material as long as the material is able to spread out and distribute the heat generated by the heating unit 30A (i.e., to mitigate the unevenness of heat generation). For example, a graphite sheet for which a ratio of thermal conductivity in the X-Y directions to thermal conductivity in the Z direction is 100 or more to 1 may be used. For example, thermal conductivity in the X-Y directions may be set to 300 W/mK or more, and thermal conductivity in the Z direction may be set to 3 W/mK. The thickness of the single-layer graphite sheet may be set to about 40 to 50 μm, for example. A carbon sheet such as a graphene sheet may be used in place of a graphite sheet as the heat transfer sheets 33 and 34.

Alternatively, only one of the heat transfer sheets 33 and 34 may be provided. Namely, a heat transfer sheet may be embedded in the insulating layer 31 only at one side of the heating element 32, i.e., either the side toward the baseplate 10 or the side toward the electrostatic chuck 40.

[Method of Making Substrate Holding Apparatus]

FIGS. 5A through 5D and FIGS. 6A and 6B are drawings illustrating examples of the process steps of making the substrate holding apparatus according to the second embodiment. A description will be given of the process steps of making the substrate holding apparatus 2 by referring to FIGS. 5A through 5D and FIGS. 6A and 6B, with the focus on the steps of forming the heating unit 30A. It may be noted that what is illustrated in FIGS. 5A through 5D and FIG. 6A is placed upside down relative to FIG. 4.

Figure 5A:
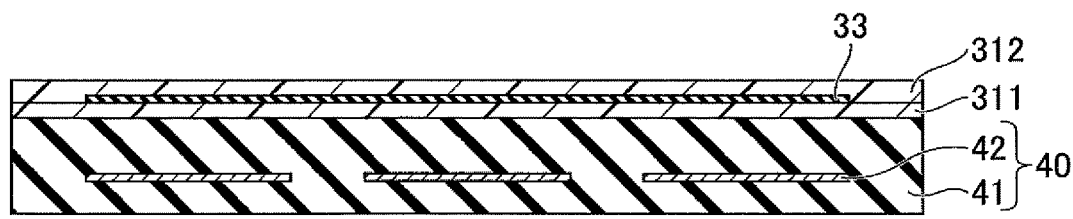
FIGS. 5A through 5D are drawings illustrating examples of process steps for making the substrate holding apparatus according to the second embodiment.

In the process step illustrated in FIG. 5A, the insulating resin film 311, the heat transfer sheet 33, and the insulating resin film 312 are successively laminated onto the electrostatic chuck after the electrostatic chuck 40 is made similarly to the process step illustrated in FIG. 2A. The insulating resin films 311 and 312 are not cured, and are left in a semi-cured state (i.e., B stage). The adhesive strength of the semi-cured insulating resin film 311 allows the insulating resin film 311 to be tentatively secured on the electrostatic chuck 40.

Figure 5B:
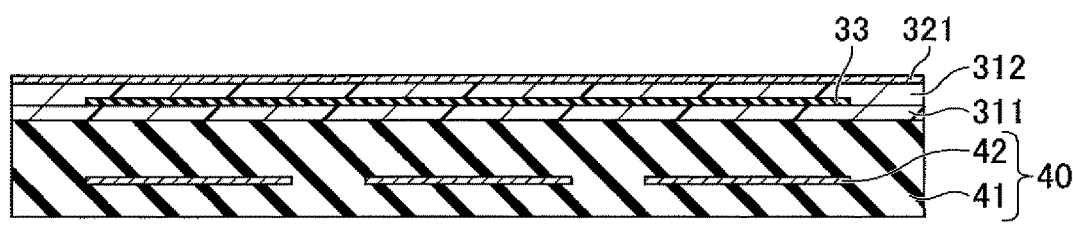

In the process step illustrated in FIG. 5B, the metal foil 321 is disposed on the insulating resin film 312. The adhesive strength of the semi-cured insulating resin film 312 allows the metal foil 321 to be tentatively secured on the insulating resin film 312. Surface treatment such as roughening is applied to the metal foil 321 prior to the placement on the insulating resin film 312 according to need.

Figure 5C:
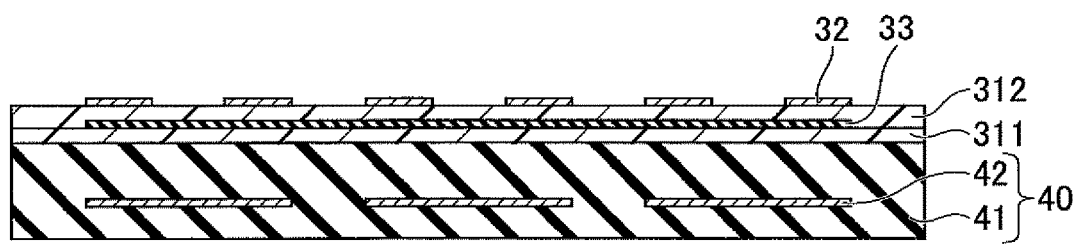

In the process step illustrated in FIG. 5C, the metal foil 321 is patterned similarly to the process step illustrated in FIG. 2D to form the heating element 32.

Figure 5D:
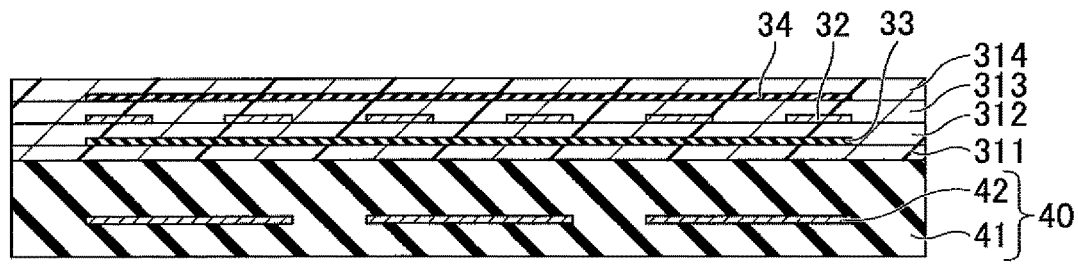

In the process step illustrated in FIG. 5D, an insulating resin film 313 covering the heating element 32, the heat transfer sheet 34, and an insulating resin film 314 are successively laminated onto the insulating resin film 312. In the process step illustrated in FIG. 6A, the insulating resin films 311, 312, 313, and 314 are heated and cured above the curing temperature while the insulating resin films 311, 312, 313, and 314 are pressed against the electrostatic chuck 40. This results in the insulating resin films 311, 312, 313, and 314 being consolidated into one insulating layer 31, thereby producing the heating unit 30A that has the heating element 32 and the heat transfer sheets 33 and 34 covered with and enclosed in the insulating layer 31, with the insulating layer 31 of the heating unit 30A being directly bonded to the electrostatic chuck 40. In consideration of the stress caused by a return to normal temperature, the heating temperature of the insulating resin films 311, 312, 313, and 314 is preferably 200 degrees Celsius or lower.

Figure 6A:
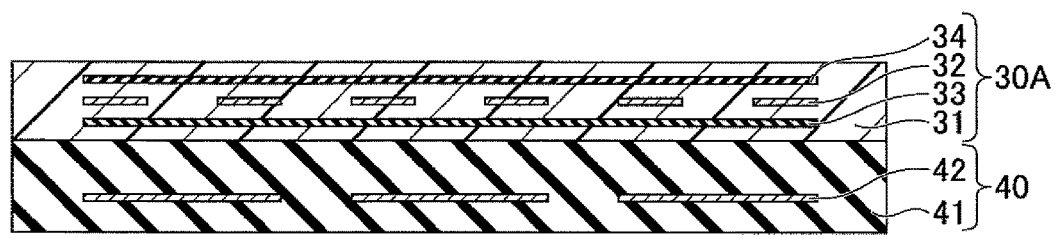
FIGS. 6A and 6B are drawings illustrating examples of process steps for making the substrate holding apparatus according to the second embodiment.
Figure 6B:
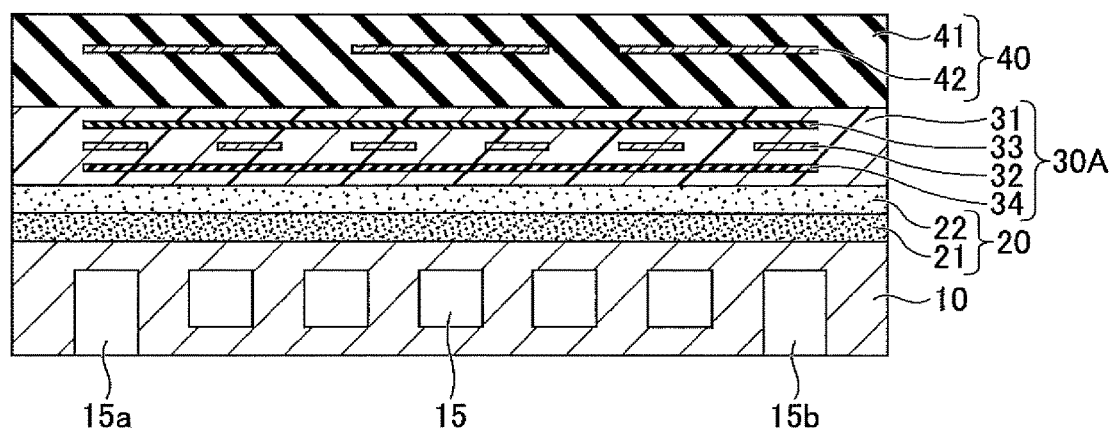

In the process step illustrated in FIG. 6B, the baseplate 10 having the coolant pathway 15 and the like formed therein is prepared, on which the first layer 21 and the second layer 22 are successively laminated to form the adhesive layer 20 (uncured). The structure illustrated in FIG. 6A is then turned upside down and placed on the baseplate 10 with the adhesive layer 20 intervening therebetween, followed by curing the adhesive layer 20. With this, the substrate holding apparatus 2 is completed in which the heating unit 30A and the electrostatic chuck 40 are successively stacked over the baseplate 10 with the adhesive layer 20 intervening therebetween.

In this manner, the substrate holding apparatus 2 of the second embodiment has the heat transfer sheets 33 and 34 having a high heat diffusion property in the planar directions (i.e., X-Y directions) and embedded in the heating unit 30A. This arrangement improves the heat diffusion property in the planar directions (i.e., X-Y directions), thereby reducing the influence of variation in the cross-sectional area size of the heating element 32 to improve thermal uniformity.

Each of the heat transfer sheets 33 and 34 may be a laminated structure of a plurality of graphite sheets. A few to a few dozen graphite sheets may be stacked one over another by use of intervening resin (e.g., bismaleimide triazine resin) that has impregnation property and does not interfere with heat transfer property in the vertical direction as well as in the horizontal direction, thereby producing a laminated structure of graphite sheets. The laminated structure of graphite sheets may have a thermal conductivity of 1500 W/mK or more in the X-Y directions and a thermal conductivity of 8 W/mK in the Z direction, for example, which provides significant improvement of the function to facilitate thermal diffusion, compared with the case in which a single-layer graphite sheet is used.

Third Embodiment

The third embodiment is directed to a configuration in which a seal member is added to the second embodiment. In connection with the third embodiment, a description of the same or similar constituent elements as those of the previously provided descriptions may be omitted as appropriate.

Figure 7:
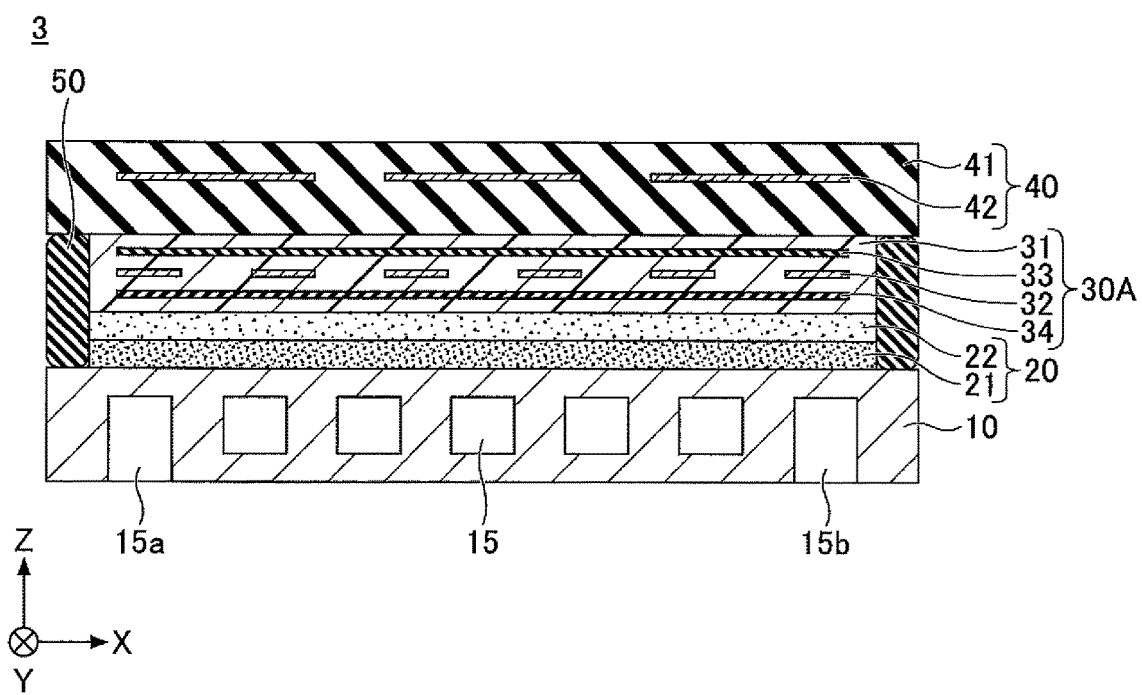
FIG. 7 is a cross-sectional view providing a schematic illustration of a substrate holding apparatus according to a third embodiment.

FIG. 7 is a cross-sectional view providing a schematic illustration of a substrate holding apparatus according to a third embodiment. In FIG. 7, a substrate holding apparatus 3 differs from the substrate holding apparatus 2 (see FIG. 4) in that a seal member 50 is additionally provided.

In the substrate holding apparatus 3, the plan shape of the adhesive layer 20 and the insulating layer 31 is one size smaller than the plan shape of the baseplate 10 and the electrostatic chuck 40. As a result, areas across which the perimeter portion of the baseplate 10 faces the perimeter portion of the electrostatic chuck 40 form an annular space where neither the adhesive layer 20 nor the insulating layer 31 is present. An annular seal member 50 is disposed in the annular space having neither the adhesive layer 20 nor the insulating layer 31 and is situated in the areas across which the perimeter portion of the baseplate 10 faces the perimeter portion of the electrostatic chuck 40. The upper face of the seal member 50 is in close contact with the lower surface of the perimeter portion of the electrostatic chuck 40, and the lower face of the seal member 50 is in close contact with the upper surface of the perimeter portion of the baseplate 10. A Teflon (registered trademark) O-ring or the like may be used as the seal member 50, for example.

When the substrate holding apparatus 2 (see FIG. 4) is used in a dry etcher, the insulating layer 31 may be subjected to strong plasma, which may cause erosion under some use conditions, resulting in heat variation and/or in the spreading of hazardous particles. The provision of the annular seal member 50 around the perimeter of the insulating layer 31 as in the substrate holding apparatus 3 serves to prevent the insulating layer from being subjected to plasma that may lead to erosion. It may be noted that a seal member similar to that of the substrate holding apparatus 3 may be provided in the substrate holding apparatus 1 (see FIG. 1).

Although a description has been given with respect to preferred embodiments and the like, the present invention is not limited to these embodiments and the like, but various variations and modifications may be made to these embodiments and the like without departing from the scope of the present invention.

The object to be held on the substrate holding apparatus is not limited to a semiconductor wafer (i.e., silicon wafer or the like), and may as well be a glass substrate or the like that is used in the process of manufacturing a liquid crystal display panel or the like, for example.

According to at least one embodiment, a substrate holding apparatus having improved heat resistance is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

Some aspects of the subject matter disclosed herein are set out in the following numbered clauses:

1. A method of making a substrate holding apparatus, comprising:
forming a heating unit on an electrostatic chuck; and
attaching the electrostatic chuck with the heating unit disposed thereon, fixedly to the base plate,
wherein the forming of the heating unit on the electrostatic chuck includes:
placing a first insulating resin film on the electrostatic chuck;
roughening at least one surface of a metal foil;
placing the roughened metal foil on the first insulating resin film;
forming a heating element by patterning the roughened metal foil;
placing a second insulating resin film on and over the first insulating resin film to cover the heating element; and
curing the first insulating resin film and the second insulating resin film to form an insulating layer that is directly bonded with the electrostatic chuck.

2. The method according to clause 1, further comprising at least one of:
laminating a third insulating resin film and a heat transfer sheet successively on the electrostatic chuck before the placing of the first insulating resin film; and
laminating a heat transfer sheet and a fourth insulating resin film successively on the second insulating resin film.

3. The method according to clause 2, wherein the heat transfer sheet is a graphite sheet.

What is claimed is:
1. A substrate holding apparatus, comprising:
a baseplate;
a heating unit disposed over the baseplate; and
an electrostatic chuck disposed on the heating unit,
wherein the heating unit includes a heating element having at least one roughened surface and an insulating layer enclosing the heating element, and the insulating layer and the electrostatic chuck are directly bonded to each other.

2. The substrate holding apparatus as claimed in claim 1, wherein the heating element is made of a rolled alloy.

3. The substrate holding apparatus as claimed in claim 2, wherein the rolled alloy is an alloy inclusive of Cu and Mn.

4. The substrate holding apparatus as claimed in claim 1, wherein a heat transfer sheet is embedded in the insulating layer on at least one side of the heating element, which is either a side toward the baseplate or a side toward the electrostatic chuck.

5. The substrate holding apparatus as claimed in claim 4, wherein the heat transfer sheet is a graphite sheet.

* * * * *